(12) United States Patent
Rubin et al.

(10) Patent No.: US 10,804,204 B2
(45) Date of Patent: *Oct. 13, 2020

(54) MULTI-CHIP PACKAGE STRUCTURE HAVING CHIP INTERCONNECTION BRIDGE WHICH PROVIDES POWER CONNECTIONS BETWEEN CHIP AND PACKAGE SUBSTRATE

(71) Applicant: International Business Machines Corporation, Armonk, NY (US)

(72) Inventors: Joshua Rubin, Albany, NY (US); Lawrence A. Clevenger, Saratoga Springs, NY (US); Charles L. Arvin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/553,453

(22) Filed: Aug. 28, 2019

(65) Prior Publication Data

US 2020/0035604 A1 Jan. 30, 2020

Related U.S. Application Data

(63) Continuation of application No. 16/043,503, filed on Jul. 24, 2018, now Pat. No. 10,535,608.

(51) Int. Cl.
*H01L 23/538* (2006.01)
*H01L 21/50* (2006.01)
*H01L 23/12* (2006.01)

(52) U.S. Cl.
CPC .......... *H01L 23/5381* (2013.01); *H01L 21/50* (2013.01); *H01L 23/12* (2013.01); *H01L 23/5383* (2013.01)

(58) Field of Classification Search
CPC . H01L 23/5381; H01L 23/12; H01L 23/5383; H01L 21/50
See application file for complete search history.

(56) References Cited

U.S. PATENT DOCUMENTS

| 5,534,466 A | 7/1996 | Perfecto et al. |
| 8,008,764 B2 | 8/2011 | Joseph et al. |
| (Continued) | | |

FOREIGN PATENT DOCUMENTS

WO PCT/IB2019/056141 11/2019

OTHER PUBLICATIONS

H. Braunisch et al., "High-Speed Performance of Silicon Bridge Die-to-Die Interconnects," IEEE 20th Conference on Electrical Performance of Electronic Packaging and Systems (EPEPS), Oct. 23-26, 2011, pp. 95-98.

(Continued)

*Primary Examiner* — Sitaramarao S Yechuri
(74) *Attorney, Agent, or Firm* — Vazken Alexanian; Ryan, Mason & Lewis, LLP

(57) ABSTRACT

Multi-chip package structures and methods for constructing multi-chip package structures are provided, which utilize chip interconnection bridge devices that are designed to provide high interconnect density between adjacent chips (or dies) in the package structure, as well as provide vertical power distribution traces through the chip interconnection bridge device to supply power (and ground) connections from a package substrate to the chips connected to the chip interconnection bridge device.

19 Claims, 11 Drawing Sheets

(56) References Cited

U.S. PATENT DOCUMENTS

| | | | |
|---|---|---|---|
| 8,064,224 B2 | 11/2011 | Mahajan et al. | |
| 8,138,015 B2 | 3/2012 | Joseph et al. | |
| 8,227,904 B2 | 7/2012 | Braunisch et al. | |
| 8,866,308 B2 | 10/2014 | Roy et al. | |
| 9,059,179 B2 | 6/2015 | Karikalan et al. | |
| 9,269,701 B2 | 2/2016 | Starkston et al. | |
| 9,275,955 B2 | 3/2016 | Mahajan et al. | |
| 9,431,347 B2 | 8/2016 | Kunieda et al. | |
| 9,653,428 B1* | 5/2017 | Hiner | H01L 25/0655 |
| 9,704,790 B1 | 7/2017 | Wu et al. | |
| 9,754,890 B2 | 9/2017 | Deshpande et al. | |
| 2003/0199121 A1 | 10/2003 | Caletka et al. | |
| 2008/0224316 A1* | 9/2008 | Kroeninger | H01L 21/6835 257/751 |
| 2011/0312129 A1* | 12/2011 | Joseph | H01L 25/0652 438/107 |
| 2012/0261838 A1* | 10/2012 | Braunisch | H01L 24/73 257/777 |
| 2013/0168854 A1* | 7/2013 | Karikalan | H01L 24/17 257/738 |
| 2013/0171796 A1* | 7/2013 | Anderson | H01L 21/2254 438/311 |
| 2014/0057411 A1* | 2/2014 | Hoang | H01L 21/78 438/460 |
| 2014/0070329 A1 | 3/2014 | Flores et al. | |
| 2014/0091474 A1 | 4/2014 | Starkston et al. | |
| 2014/0130969 A1* | 5/2014 | McCutcheon | B32B 7/06 156/247 |
| 2014/0131854 A1 | 5/2014 | Hawk et al. | |
| 2014/0252599 A1 | 9/2014 | Kwon et al. | |
| 2014/0360759 A1* | 12/2014 | Kunieda | H01L 21/4846 174/251 |
| 2015/0171015 A1* | 6/2015 | Mahajan | H01L 23/5381 257/712 |
| 2016/0293572 A1 | 10/2016 | We et al. | |
| 2016/0307870 A1 | 10/2016 | Kelly et al. | |
| 2016/0343666 A1* | 11/2016 | Deshpande | H01L 23/5383 |
| 2016/0372448 A1 | 12/2016 | Yazdani | |
| 2017/0104029 A1* | 4/2017 | Li | H01L 27/228 |
| 2017/0110419 A1* | 4/2017 | Shih | H01L 25/0655 |
| 2017/0125334 A1* | 5/2017 | Wang | H01L 23/3114 |
| 2018/0130708 A1* | 5/2018 | Mohanty | H01L 21/02118 |
| 2018/0145031 A1 | 5/2018 | Braunisch et al. | |
| 2018/0158712 A1* | 6/2018 | Ekkels | H01L 21/561 |
| 2018/0286840 A1* | 10/2018 | Nair | H01L 25/105 |

OTHER PUBLICATIONS

R. Mahajan et al., "Embedded Multi-Die Interconnect Bridge (EMIB)—A High Density, High Bandwidth Packaging Interconnect," IEEE 66th Electronic Components and Technology Conference (ECTC), May 31-Jun. 3, 2016, pp. 557-565.

K. Oi et al., "Development of New 2.5D Package with Novel Integrated Organic Interposer Substrate with Ultra-fine Wiring and High Density Bumps," IEEE 64th Electronic Components and Technology Conference (ECTC), May 27-30, 2014, pp. 348-353.

C. Narayan et al., "Thin Film Transfer Process for Low Cost MCM-D Fabrication," Proceedings of the International Conference on Multichip Modules (MCM), Apr. 13-15, 1994, pp. 105-114.

List of IBM Patents or Patent Applications Treated as Related.

\* cited by examiner

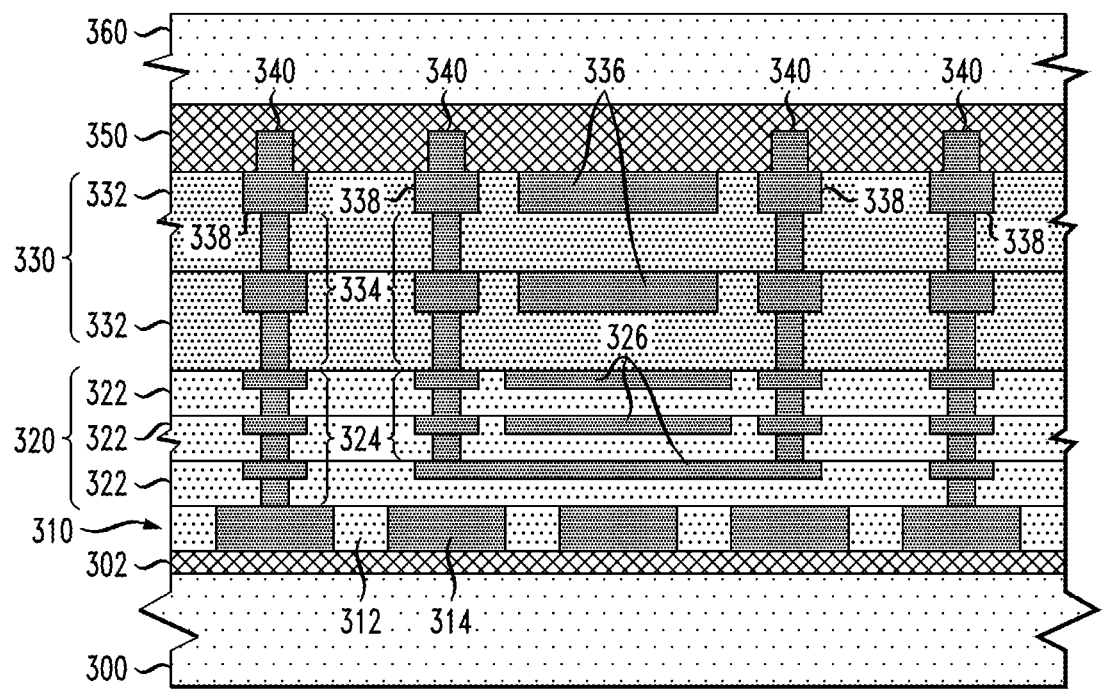

MULTI-CHIP PACKAGE STRUCTURE HAVING CHIP INTERCONNECTION BRIDGE WHICH PROVIDES POWER CONNECTIONS BETWEEN CHIP AND PACKAGE SUBSTRATE

TECHNICAL FIELD

This disclosure generally relates to semiconductor packaging techniques and, in particular, to multi-chip package structures which implement chip interconnection bridge devices.

BACKGROUND

Innovations in semiconductor fabrication and packaging technologies have enabled the development of smaller scale, higher density integrated circuit (IC) chips (or dies), as well as the development of highly integrated chip modules with wiring and area array input/output (I/O) contact densities that enable dense packaging of IC chips (or dies). For certain applications, high-performance electronic modules are constructed with one or more multi-chip modules (MCMs) mounted to a circuit board (e.g., a system board (or node card), a printed circuit board, a printed wiring board, etc.) using a suitable area array connection technique for module-to-board I/O interconnections (e.g., land grid array (LGA) or ball grid array (BGA) connections). MCM technology can be utilized to form a first level package structure with high-density packaging of multiple IC processor chips for computer server applications, or multiple heterogeneous chips for custom applications, etc.

Various conventional techniques can be utilized to construct an MCM package structure. For example, an MCM can be constructed by connecting multiple semiconductor IC dies directly to a package substrate. The semiconductor IC dies can be connected to a surface of the package substrate using wiring bonding, tape bonding, or flip-chip bonding. For high performance and high-density packages, direct chip attachment (DCA) techniques are commonly used for flip-chip bonding IC dies to the package substrate using area arrays of solder interconnects formed between contact pads on active surfaces of the semiconductor IC dies and matching arrays of contact pads formed on a chip mounting surface (or top-side surface) on the package substrate. The package substrate includes wiring for providing die-to-die connections between IC dies mounted to the top-side of the package substrate, as well as wiring for connecting the top-side contacts pads to bottom-side contact pads.

In conventional MCM technologies, the package substrate can be, e.g., a glass-ceramic substrate, or a laminate substrate. For example, a multi-layer ceramic package substrate can be fabricated using low-temperature co-fired ceramic (LTCC) substrate technology. In addition, a laminate package substrate can be fabricated using surface laminate circuit (SLC) technology to produce low-cost organic package substrates with build-up layers that are vertically connected through micro-vias to support solder-bumped flip-chips.

There is a continued demand for IC chips with increasing integrated functionality and smaller footprint sizes, which leads to increases in the I/O count and I/O density of the IC chips. Moreover, high-performance and high-density integrated package solutions typically require small micro-bumps for flip-chip connectivity using interconnect pitches of, e.g., 50 microns or less, and line width and line spacing design rules of 10 microns or less. While an MCM package structure allows heterogeneous IC dies to be directly connected (e.g., DCA) to each other through the package substrate, conventional ceramic-based package substrate and laminate substrate technologies are limited with regard to the smallest achievable contact pad pitch, line width and line spacing. As such, conventional ceramic and organic laminate build up substrates are a bottleneck to high-density packaging, as such substrate technologies cannot support the tight pitches needed for high-density I/O flip-chip connections and high-density die-to-die interconnections.

To address these limitations, 2.5-D packaging techniques are utilized to increase I/O density and provide high-density routing for low power die-to-die communication. In general, 2.5-D integration involves flip-chip bonding multiple IC dies on a passive interposer substrate (e.g., silicon, glass, or fine-pitch organic build substrate), wherein the passive interposer substrate is bonded to the package substrate. As compared to the package substrate, the interposer comprises finer pitch wiring, higher contact pad densities, and shorter distances for die-to-die interconnects.

A silicon interposer for 2.5 D packaging consists of a thin layer of silicon which is disposed between the IC dies and the package substrate, and which comprises through-silicon vias (TSVs) to provide a platform with high wiring density for I/O redistribution and die-to-die communication. Silicon interposers require large and expensive silicon chips with TSVs to accommodate multiple chips on the top surface. Unfortunately, silicon interposers are expensive due to the size of the silicon interposer chip needed to accommodate the footprints of multiple dies attached to the surface of the silicon interposer, and due to the use of TSV technology which increases fabrication costs and complexity.

On the other hand, a fine-pitch organic build-up interposer for 2.5 D packaging utilizes thin film technology to build fine-pitch organic redistribution layers on top of a conventional organic laminate substrate. While the fine-pitch organic redistribution layers provide a platform with high wiring density for I/O redistribution and die-to-die communication, such technology is limited in the number of fine-pitch redistribution layers and minimum wire pitch that is achievable, as compared to silicon-based interposer solutions.

Other 2.5 D packaging solutions utilize silicon bridge devices that are embedded into a package substrate to provide tighter interconnect density between adjacent dies. The silicon bridge devices are lower in cost than conventional silicon interposers as silicon bridge devices are much smaller (they only connect to peripheral regions of adjacent dies) and do not utilize costly TSVs. Although silicon bridge devices are simple in form, conventional bridge devices are designed to only include wiring for die-to-die interconnection, but not wiring for, e.g., vertical power distribution through the bridge device from the package substrate to the dies.

However, with increasing IC die functionality and density, there is a need for an increasing number of power and ground pins to minimize ground bounce. As such, IC dies are typically fabricated with power/ground pads dispersed over the area array of I/O contact pads on the back-side of the IC dies. When silicon bridge devices are used for high-density die-to-die I/O interconnections, the bridge devices block vertical power distribution through the bridge structure to power/ground pads that are disposed within the high-density I/O areas of the IC dies which are overlapped by the bridge devices. As such, connections to such power/ground pads must be made from the package substrate to other regions of the IC dies which are not overlapped by the bridge devices, and then routed through the IC dies (as well as through lateral interconnection in the bridge devices) to the power/ground pads blocked by the bridge devices. This configuration increases the length of the power/ground traces, thus increasing the voltage drop and IR heating within the package substrate.

SUMMARY

Embodiments of the invention include multi-chip package structures which comprise chip interconnection bridge devices that are designed to provide high I/O interconnect density between adjacent chips in the package structure, as well as provide vertical power distribution traces through the chip interconnection bridge device to supply power (and ground) connections from a package substrate to the chips connected to the to chip interconnection bridge device. For example, one embodiment includes a package structure which comprises a package substrate, an interconnect bridge device connected to the package substrate, a first integrated circuit die connected to the interconnect bridge device and to the package substrate, and a second integrated circuit die connected to the interconnect bridge device and to the package substrate. The interconnect bridge device comprises wiring to provide die-to-die connections between the first and second integrated circuit dies, and wiring to provide package-to-die connections between the package substrate and the first and second integrated circuit dies, wherein the package-to-die connections comprise power connections.

Other embodiments will be described in the following detailed description of embodiments, which is to be read in conjunction with the accompanying figures.

BRIEF DESCRIPTION OF THE DRAWINGS

FIG. 7 is a cross-sectional side view of the bridge wafer of FIG. 6 after bonding a second temporary carrier substrate to a front-side of the bridge wafer.

FIG. 8 is a cross-sectional side view of the bridge wafer of FIG. 7 after removing the first temporary carrier substrate from the back-side of the bridge wafer, forming solder bumps on the bond pads on the back-side of the bridge wafer, and dicing the bridge wafer and the second temporary carrier substrate to form an individual chip interconnect bridge device.

DETAILED DESCRIPTION

Embodiments of the invention will now be discussed in further detail with regard to multi-chip package structures which comprise chip interconnection bridge devices that are designed to provide high I/O interconnect density between adjacent chips in the package structure, as well as provide vertical power distribution traces through the chip interconnection bridge device to supply power (and ground) connections from a package substrate to the chips connected to the to chip interconnection bridge device. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Figure 1:
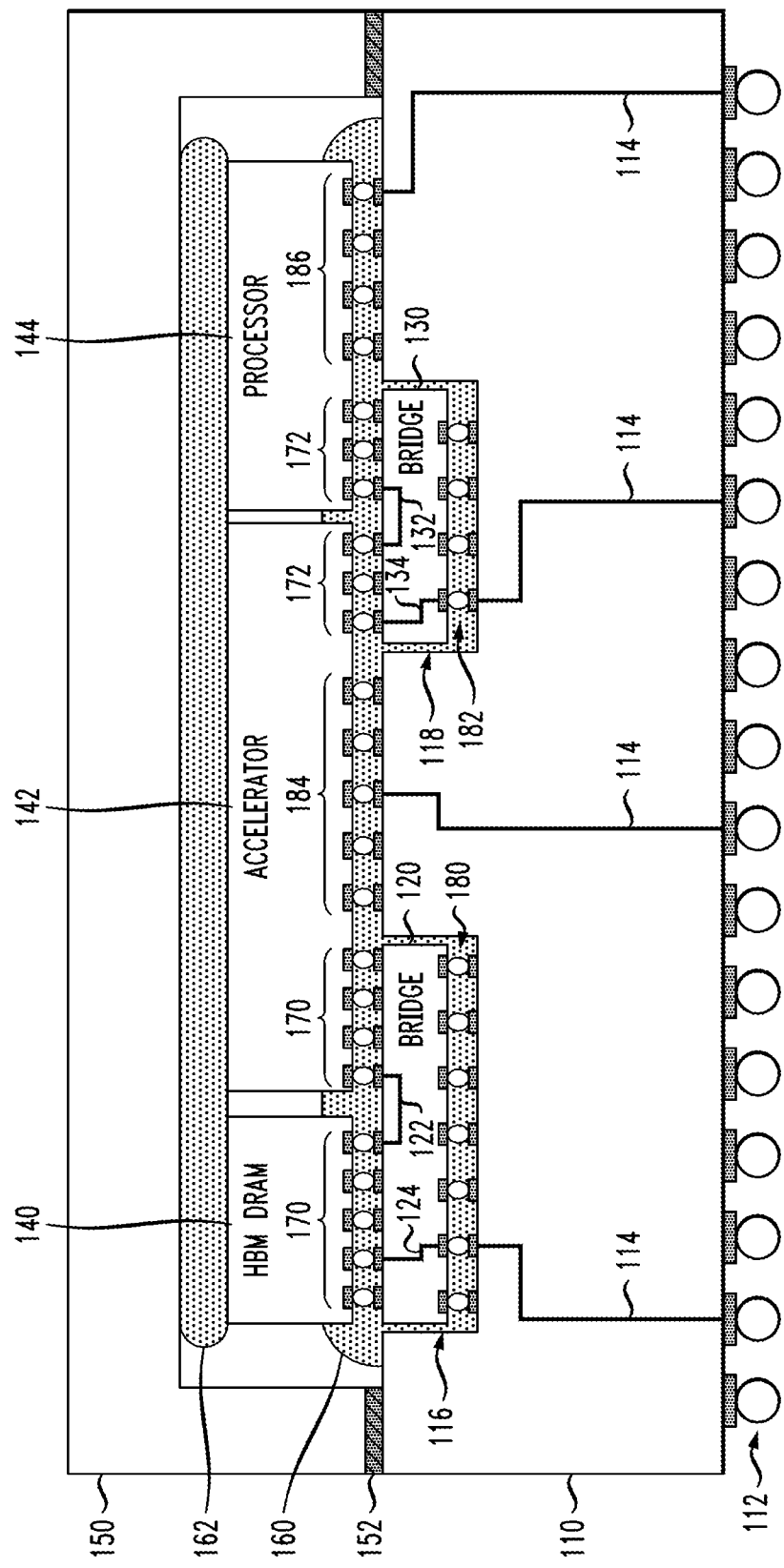
FIG. 1 schematically illustrates a multi-chip package structure comprising chip interconnect bridge devices, according to an embodiment of the invention.

FIG. 1 schematically illustrates a multi-chip package structure comprising chip interconnect bridge devices, according to an embodiment of the invention. In particular, FIG. 1 schematically illustrates a package structure 100 comprising a package substrate 110, first and second chip interconnect bridge devices 120 and 130 (or "bridge device"), a plurality of IC dies 140, 142, and 144, and a package lid 150. A bonding layer 152 (e.g., epoxy glue) bonds the package lid 150 to a peripheral surface region on a top side of the package substrate 110. An underfill material 160 is disposed between the IC dies 140, 142, 144, and the package substrate 110, and a thermal interface material 162 is disposed between the top-sides of the IC dies 140, 142 and 144 and the package lid 150. The underfill material 160 comprises an electrically-insulating adhesive material which is utilized to maintain the structural integrity of the flip-chip connections between (i) the IC dies 140, 142, 144 and the package substrate 110, (ii) the IC dies 140, 142, 144 and the bridge devices 120 and 130, and (iii) the bridge devices 120 and 130 and the package substrate 110. In an alternate embodiment, the underfill material 160 may be comprised of different underfill material layers, e.g., one underfill material layer in the bridge region, and another underfill material layer outside the bridge region. The thermal interface material 162 comprises a thermal paste which is designed to conduct thermal energy generated by the IC dies 140, 142 and 144 to the package lid 150, wherein the package lid 150 serves as a heat-spreader to dissipate the thermal energy and cool the IC dies 140, 142 and 144.

For a heterogeneous packaging application, the IC dies 140, 142 and 144 may comprise any type integrated circuits and system to implement a given application. For illustrative purposes, the exemplary package structure 100 of FIG. 1 show three IC dies, wherein the first IC die 140 comprises a high-bandwidth memory (HBM) dynamic random-access memory (DRAM) device, the second IC die 142 comprises a hardware accelerator device, and wherein the third IC die 144 comprises a multi-core processor device. In other embodiments, the IC dies 140, 142 and 144 (and other additional IC dies) may comprise one or more of a memory device, central processing unit (CPU), a microcontroller, an application-specific integrated circuit (ASIC), a field programmable gate array (FPGA), and other types of general purposes processors or work-load optimized processors such as graphics processing units (GPUs), digital signal processors (DSPs), system-on-chip (SoC), and other types of specialized processors or coprocessors that are configured to execute one or more fixed functions.

The package substrate 110 can be a ceramic substrate, a silicon substrate or an organic laminate build-up substrate, or any other type of package substrate technology that is suitable for the given application. The package substrate 110 comprises an area array of solder ball interconnects 112 (e.g., Ball Grid Array (BGA) solder interconnects) formed on a bottom side of the package substrate 110, a network of package traces 114 which vertically and horizontally extend through the package substrate 110, and first and second recessed cavities 116 and 118 formed in the top side of the package substrate 110. In the example embodiment of FIG. 1, the first bridge device 120 is disposed in the first recessed cavity 116, and the second bridge device 130 is disposed in the second recessed cavity 118 of the package substrate 110.

The first bridge device 120 is connected to the first and second IC dies 140 and 142 using area arrays of flip-chip bump connections 170, and the second bridge device 130 is connected to the second and third IC dies 142 and 143 using area arrays of flip-chip bump connections 172. Further, the first bridge device 120 is connected to a surface of the package substrate 110 at the bottom of the first recessed cavity 116 using an area array of flip-chip bump connections 180. Similarly, the second bridge device 130 is connected to a surface of the package substrate 110 at the bottom of the second recessed cavity 118 using an area array of flip-chip bump connections 182. The IC dies 142 and 144 are connected to the top-side of the package substrate 110 using respective area arrays of flip-chip bump connections 184 and 186.

In one embodiment, the area arrays of flip-chip bump connections 170 and 172 comprise micro-bumps for high density I/O signal communication between the adjacent dies, wherein the flip-chip micro-bump connections 170 and 172 are formed with a contact pitch of about 55 microns or less, depending on the application. Further, the flip-chip bump connections 180, 182, 184 and 186 comprise I/O connections between (i) the package substrate 110 and the bridge devices 120 and 130 and (ii) the package substrate 110 and the IC dies 142 and 144. In one embodiment, the flip-chip bump connections 180, 182, 184 and 186 have a coarser pitch than the flip-chip bump connections 170 and 172. In another embodiment, the flip-chip bump connections 184 and 186 comprise fine-pitch micro-bump connections. In one embodiment, the area arrays of flip-chip bump connections 180, 182, 184 and 186 are formed with a contact pitch of about 75 microns or greater, depending on the application. The area array of solder ball interconnects 112 (e.g. BGA C4s) on the bottom side of the package substrate 110 are formed with a contact pitch of about 300 microns or greater, depending on the application.

The first bridge device 120 comprises fine-pitch wiring 122 for connecting the area arrays of micro-bumps 170 to provide high-density, high bandwidth I/O connectivity between the first and second IC dies 140 and 142. Similarly, the second bridge device 130 comprises fine-pitch wiring 132 for connecting the area arrays of micro-bumps 172 to provide high-density, high bandwidth I/O connectivity between the second and third IC dies 142 and 144. The fine-pitch wiring 122 and 132 of the bridge devices 120 and 130 can be formed with sub-micron line-width and line-spacing design rules using bridge fabrication techniques discussed in further detail below.

In addition, the first bridge device 120 comprises vertical distribution traces 124 to provide direct power and ground connections from the package substrate 110 to the first IC die 140 and/or the second IC die 142 through the first bridge device 120. Similarly, the second bridge device 130 comprises vertical distribution traces 134 to provide direct power and ground connections from the package substrate 110 to the second IC die 142 and/or the third IC die 144 through the second bridge device 130. As noted above, with high-density IC die functionality and I/O, a number of power and ground pads may be included within area arrays of micro-bumps 170 and 172 of the IC dies 140, 142, and 144 to minimize ground bounce.

In the package structure of FIG. 1, the first and second bridge devices 120 and 130 are designed to provide vertical power/ground distribution through the bridge devices 120 and 130 to the power/ground pads that are disposed within the high-density I/O area arrays 170 and 172 of the IC dies 140, 142 and 144, which are overlapped by the bridge devices 120 and 130. As such, connections to such power/ ground pads within the high-density I/O area arrays 170 and 172 of the IC dies 140, 142 and 144 can be made directly from package-to-die through the bridge devices 120 and 130. For example, as shown in FIG. 1, a power/ground connection to the first IC die 140 can be routed along a path from a package trace 114 of the package substrate 110, to a flip-chip connection 180 between the package substrate 110 and the first bridge device 120, to a vertical trace 124 through the first bridge device 120, and to the first IC die 140 through a flip-chip connection 170 between the first bridge device 120 and the first IC die 140.

This is in contrast to conventional bridge devices which do not include the vertical distribution traces 124 and 134 as shown in FIG. 1. For example, assume that the first bridge device 120 in FIG. 1 did not include the vertical power/ ground distribution wiring 124, and that the area array of flip-chip connections 170 to the first IC die 140 include power/ground connections. In this instance, a power/ground connection to the first IC die 140 would have to be routed along a path from a package trace 114 of the package substrate 110, to a flip-chip connection 184 between the second IC die 142 and the package substrate 110, to distribution wiring between the flip-chip connection 184 and a flip-chip connection 170 at the periphery of the second IC die 142, and to the power/ground connection within the area array of flip-chip connections 170 of the first IC die 140 through redistribution wiring 122 of the first bridge device 120. This conventional configuration would significantly increase the length of the power/ground traces (as compared to the direct connection from package-to-die through the first bridge device 120, as discussed above.

While the flip-chip bump connections 170, 172, 180, 182, 184 and 186 are generically illustrated in FIG. 1 for ease of illustration, it is to be understood that the flip-chip bump connections 170, 172, 180, 182, 184 and 186 can be implemented using any suitable flip-chip bump technology. For example, the flip-chip bump connections 170, 172, 180, 182, 184 and 186 can be implemented using controlled collapse chip connection (C4) flip-chip bump technology where solder balls are formed on ball limiting metallurgy (BLM) pads or under bump metallization (UBM) pads. The solder balls can be formed by solder paste printing or electroplating. In other embodiments, the flip-chip bump connections 170, 172, 180, 182, 184 and 186 can be chip connection (C2) bumps comprising metallic pillar structures (e.g. copper pillars) that are formed on metal pads. The metallic pillar bump structures may or may not have solder endcaps. In other embodiments, the flip-chip bump connections 170, 172, 180, 182, 184 and 186 can be C2 bumps with plated metal formed on UBM pads.

In other embodiments, solder micro bumps comprising Cu and Sn can be electroplated on UBM pads, wherein the UBM pads comprise electroless plated nickel and immersion gold. The joining of the two flip-chip elements can be performed by joining CuSn solder micro bumps on one flip-chip element to UBM pads on another flip-chip element, or by joining CuSn solder micro bumps on one flip-chip element to CuSn solder micro bumps on another flip-chip element. In other embodiments, an area array of copper pillar bumps on one flip-chip element can be bonded to an area array of solder balls on another flip-chip element. In addition, an area array of high-temperature solder bumps formed on UBM pads on one flip-chip element can be joined to an area array of low temperature solder bumps formed on contact pads of another flip-chip element.

As further shown in FIG. 1, in some embodiments, a footprint of the first IC die 140 (e.g., HBM DRAM) either entirely or substantially overlaps the interconnect bridge device 120 such that all input/output, power/ground, and other connections between the first integrated circuit die 140 and the package substrate 110 is routed through the interconnect bridge device 120. In some embodiments of package structures, there can be a small IC die (relative to a large IC die such as an accelerator (e.g., GPU)) which has a bridge device that fully supports the footprint of the smaller IC die, while only partially overlapping the larger IC die. In this instance, the bridge device can be irregularly shaped (e.g., non-rectangular) in order to accommodate both the smaller and larger IC dies that are attached to the bridge. There are various advantages to forming bridge devices which fully support small IC dies. For example, with a small IC die such as an HBM DRAM, the spacing between various regions of the bump footprint may be very small (e.g., spacing between power region and signal I/O region can be 75 microns or less). This tight spacing between bump regions makes it very difficult to mount the small IC die to the bridge device using only a portion of the bump footprint of the small IC die while still accommodating bumps with the package laminate substrate outside of the region of the bridge device. In this instance, it may not be possible to join some bumps near the edge of the bridge device. Additionally, with an IC die that has all micro-bumps, it may be difficult to flip-chip mount the IC die to both the bridge device and the package laminate substrate with micro-bumps, since they are both at fine pitch. Therefore, in this instance, it would easier to flip-chip mount the entire IC die to the bridge device.

Figure 2:
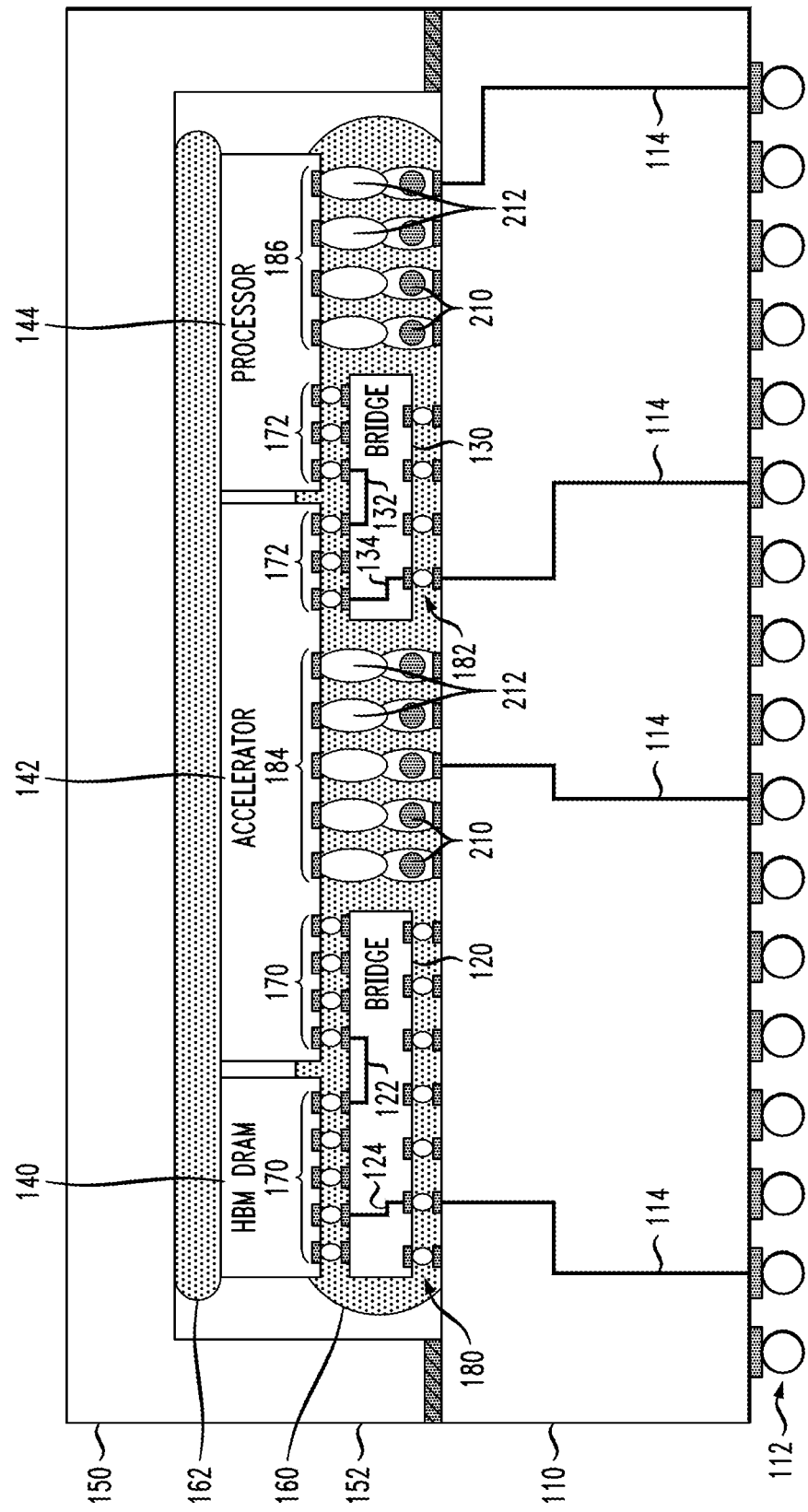
FIG. 2 schematically illustrates a multi-chip package structure comprising chip interconnect bridge devices, according to another embodiment of the invention.

FIG. 2 schematically illustrates a multi-chip package structure comprising chip interconnect bridge devices, according to another embodiment of the invention. In particular, FIG. 2 schematically illustrates a package structure 200 which is similar to the package structure 100 of FIG. 1, except that in the package structure 200 of FIG. 2, the first and second bridge devices 120 and 130 are mounted to the top-side of the package substrate 110, as compared to being disposed and mounted within the recessed cavities of 116 and 118 of the package substrate 110.

In addition, in the example embodiment shown in FIG. 2, the area arrays of flip-chip connections 184 and 186 between the IC dies 142 and 144 and the package substrate 110 comprise standoff structures 210 formed on the top-side of the package substrate 110 to offset the height of the bridge devices 120 and 130. In addition, larger diameter solder bumps (or taller bump structures) 212 can be formed on area array contact pads on the back-sides of the IC dies 142 and 144 to offset the height of the bridge devices 120 and 130. In one embodiment, as schematically shown in FIG. 2, the standoff structures 210 comprise solder-coated copper balls that are disposed on area array contact pads formed on the top-side of the package substrate 110. In another embodiment, the standoff structures 210 may comprise copper pillars, or copper pillars with solder end caps, or other types of standoff structures which are suitable for the given application.

Various methods for fabricating chip interconnect bridges, and constructing multi-chip package structures comprising chip interconnection bridges, will now be discussed in further detail with reference to FIGS. 4 through 15. In general, interconnect bridges according to embodiments of the invention are formed on a temporary carrier substrate using wafer level fan out (WLFO) techniques in conjunction with back-end-of-line (BEOL) fabrication methods and common BEOL dielectric and metallic materials to form bridge structures comprising multiple layers of wiring and inter-layer vias which provide high density die-to-die interconnect wiring for high-bandwidth I/O communication between package dies, as well as redistribution layers to route power/ground connections through the bridge structures from the bottom-side flip-chip connections with the package substrate to the top-side flip-chip connections with the IC dies. In addition, in one embodiment, a "chip-first" package assembly process is implemented which comprises flip-chip bonding a bridge device to two or more IC dies, and then flip chip bonding the assembly of the bridge device and IC dies to a package substrate. In another embodiment, a "chip-last" package assembly process is implemented which comprises flip-chip bonding a bridge device to a package substrate, and then flip-chip bonding two or more IC dies to the assembly of the bridge device and package substrate.

Figure 3:
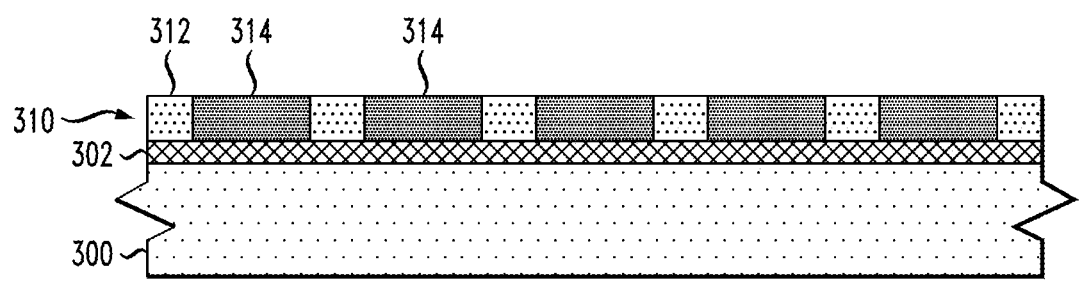
FIG. 3 is a cross-sectional side view of a bridge wafer at an intermediate stage of fabrication in which an initial layer of a back-side of the bridge wafer comprising bond pads is formed on a first temporary carrier substrate.

In particular, FIG. 3 through FIG. 10 schematically illustrate a process for fabricating bridge devices and a "chip-last" package assembly process, according to an embodiment of the invention. To begin, FIG. 3 is a cross-sectional side view of a bridge wafer at an intermediate stage of fabrication in which an initial layer of a back-side of the bridge wafer comprising bond pads is formed on a first temporary carrier substrate. In particular, FIG. 3 illustrates a first temporary carrier substrate 300 (or carrier wafer) upon which a bridge wafer, which comprises a plurality of individual bridge devices, is to be formed using WLFO and BEOL processing techniques. The first temporary carrier substrate 300 can be a glass substrate or a silicon substrate, for example. Further, FIG. 3 illustrates an initial stage of bridge wafer formation in which an adhesive layer 302 is applied on a surface of the first temporary carrier substrate 300. The adhesive layer 302 is formed of any suitable adhesive material (e.g., epoxy) which serves as a release layer that can be ablated or vaporized using suitable release techniques (e.g. IR laser ablation) to release the first temporary carrier substrate 300 at a later stage in the fabrication process flow. In another embodiment, when the first temporary carrier substrate 300 comprises a silicon carrier substrate, the bridge wafer can be formed directly on a surface of the silicon carrier substrate (without the adhesive layer 302) such that the silicon carrier substrate can be subsequently removed using a silicon grinding process. Various techniques (e.g., laser ablation) can be utilized to release a glass or silicon carrier substrate when an adhesive layer is utilized to bond to the bridge wafer.

Next, a bond pad layer 310 is formed on the adhesive layer 302. The bond pad layer 310 comprises a passivation layer 312 and an area array of bond pads 314. In one embodiment, the bond pad layer 310 is formed by depositing and patterning a layer of dielectric/insulating material (as the passivation layer 312) to form trenches, and depositing a layer of metallic material (e.g., copper) to fill the trenches with the metallic material to form the bond pads 314. A chemical-mechanical polishing (CMP) process is then performed to remove the overburden metallic material and planarize the bond pad layer 310 down to the surface of the passivation layer 312. In another embodiment, the passivation layer 312 may comprise an organic polymer material. Although a small portion of the bond pad layer 310 is shown in FIG. 3 for ease of illustration, the bond pad layer 310 is formed to include area arrays of bottom side bond pads for multiple bridge devices of the bridge wafer. In an alternate embodiment, the bond pad layer 310 can be formed using a back-side processing module after removing the first temporary carrier substrate 300. In yet another embodiment, the bridge wafer may comprise a stack of organic redistribution layers formed on the back-side of the bridge wafer, in addition to, or instead of redistribution layer formed on the front-side of the bridge wafer.

Figure 4:
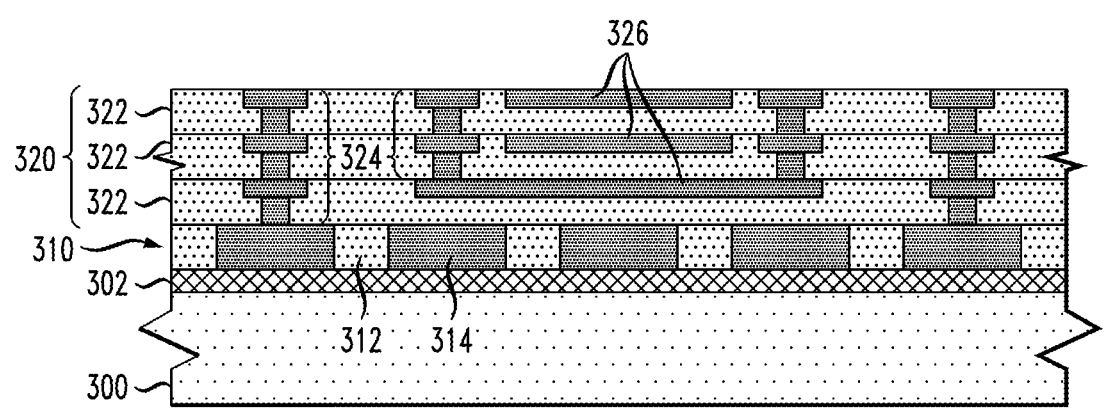
FIG. 4 is a cross-sectional side view of the bridge wafer of FIG. 3 after forming a stack of signal interconnect and redistribution layers comprising fine pitch signal wires and vertical inter-level vias.

Next, FIG. 4 is a cross-sectional side view of the bridge wafer of FIG. 3 after forming a stack of signal interconnect and redistribution layers 320 comprising fine pitch signal wires and vertical inter-level vias. In particular, the stack of signal interconnect and redistribution layers 320 comprises a plurality of metallization layers comprising inter-level dielectric (ILD) layers 322 and metallic interconnect structures comprising vertical vias 324 (and associated via landing pads) and horizontal wiring 326 embedded within the ILD layers 322. The ILD layers 322 can be formed using dielectric materials which are commonly used for BEOL fabrication, including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). The ILD layers 322 may be deposited using known deposition techniques, such as, for example, atomic layer deposition (ALD), chemical vapor deposition (CVD), plasma-enhanced CVD (PECVD), physical vapor deposition (PVD), or spin-on deposition.

The vertical vias 324 and horizontal wiring 326 embedded within the ILD layers 322 collectively provide high-density die-to-die I\O interconnections, as well as redistribution wiring for connecting the bottom-side bond pads 312 to top-side bond pads of the bridge wafer. The vertical vias 324, and horizontal wiring 326 (including via landing pads) can be formed using metallic materials which are commonly used for BEOL fabrication, including, but not limited to, copper, cobalt, ruthenium, etc. For example, in one embodiment, the vertical vias 324 and horizontal wiring 326 are formed with copper using single and/or dual damascene metallization processes. In addition, depending on the dielectric and metallic materials used to form the ILD layers 322 and the vertical vias 324 and horizontal wiring 326, thin diffusion barrier and seed layers can be deposited to line trenches form in the ILD layers 322 prior to metal deposition, using known materials and deposition techniques.

Figure 5:
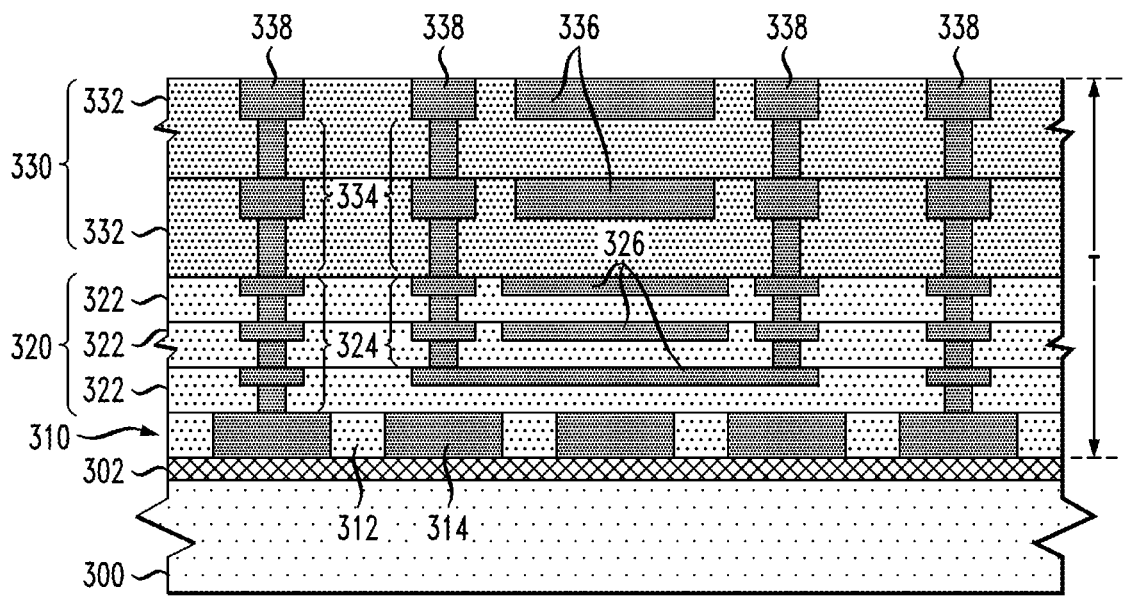
FIG. 5 is a cross-sectional side view of the bridge wafer of FIG. 4 after forming a stack of power distribution layers comprising coarse pitch wires, vertical inter-level vias, and top-side bond pads of the bridge wafer.

Next, FIG. 5 is a cross-sectional side view of the bridge wafer of FIG. 4 after forming a stack of power distribution layers 330 comprising coarse pitch wires, vertical inter-level vias, and top-side bond pads of the bridge wafer. In particular, the stack of power distribution layers 330 comprises a plurality of insulating layers 332 and metallic interconnect structures comprising vertical vias 334 (and associated via landing pads), horizontal wiring 336, and top-side bond pads 338. In one embodiment, the stack of power distribution layers 330 is formed using standard organic laminate build-up layers in which the insulating layers 332 are formed of an organic material (e.g. polyimide, FR4, etc.). The use of organic build-up layers facilitates the fabrication of thicker wiring and interconnects for purposes of power distribution through the bridge structures, while also providing vertical via connectivity from the top-side bonding pads 338 to the stack of signal interconnect and redistribution layers 320. In other embodiments, the stack of power distribution layers 330 can be fabricated using standard BEOL fabrication methods, with different design rules than the BEOL processes used to fabricate the stack of signal interconnect and redistribution layers 320. The resulting bridge wafer structure shown in FIG. 5 comprises a thickness T in a range of about 50 microns to about 70 microns.

Figure 6:
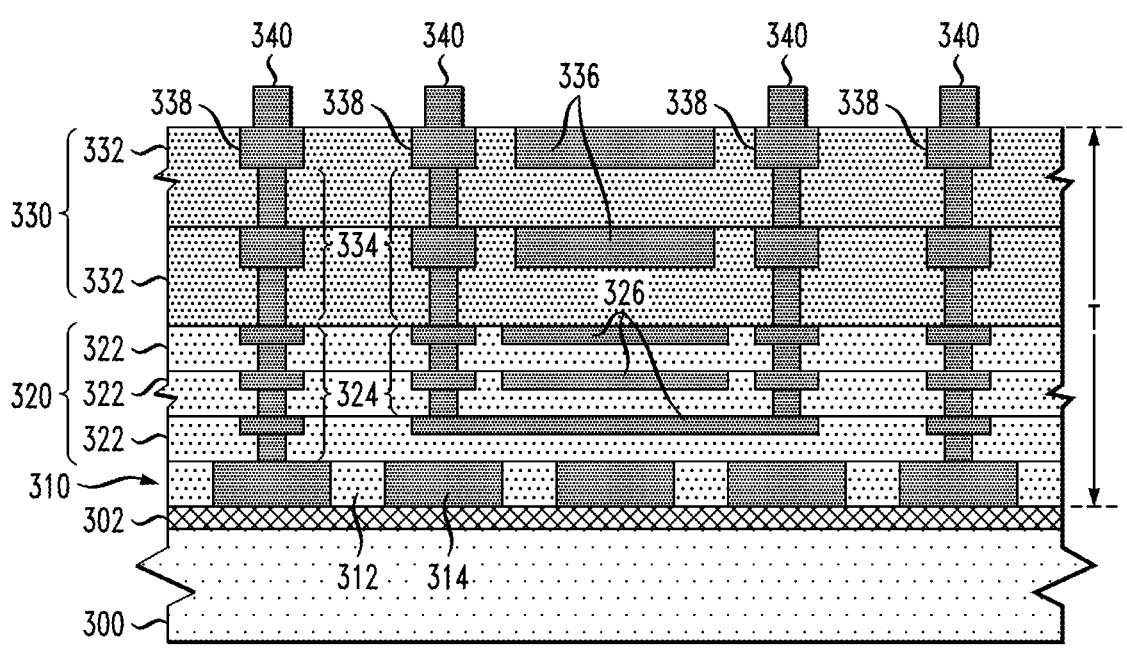
FIG. 6 is a cross-sectional side view of the bridge wafer of FIG. 5 after forming flip-chip bumps on the top-side bond pads of the bridge wafer.

FIG. 6 is a cross-sectional side view of the bridge wafer of FIG. 5 after forming flip-chip bumps 340 on the top-side bond pads 338 of the bridge wafer. The flip-chip bumps 340 can formed using one of various techniques. For example, the flip-chip bumps 340 can be C4 solder bumps formed on UBM or BLM pads. In another embodiment, the flip-chip bumps 340 can be plated bumps (e.g., nickel, copper, gold, tin plated bumps) that are formed on the bonding pads 338 using electroless plating techniques. In another embodiment, the flip-chip bumps can be copper pillar structures with, or without, solder end caps.

Next, FIG. 7 is a cross-sectional side view of the bridge wafer of FIG. 6 after bonding a second temporary carrier substrate 360 to a front-side of the bridge wafer. In particular, FIG. 7 illustrates an exemplary embodiment wherein a releasable adhesive layer 350 is applied to the top-side of the bridge wafer, and wherein the second temporary carrier substrate 360 is bonded to the bridge wafer by the adhesive layer 350. The second temporary carrier substrate 360 is an optional structure that is used when back-side processing is needed such as, e.g., grinding away the first temporary carrier substrate 300 and adhesive layer 302, or forming flip-chip bumps on the bottom-side bond pads 314, etc. In another embodiment, when no back-side processing of the bridge wafer is needed, the bridge wafer can be mounted face down on wafer dicing tape, followed by removal of the first temporary carrier substrate 300, and dicing the bridge wafer into individual bridge devices.

FIG. 8 is a cross-sectional side view of the bridge wafer of FIG. 7 after removing the first temporary carrier substrate 300 from the back-side of the bridge wafer, forming solder bumps 370 (e.g., C4 solder bumps) on the bond pads 314 on the back-side of the bridge wafer, and dicing the bridge wafer and the second temporary carrier substrate 360 along dicing lines D (illustrated by dashed lines) to form an individual chip interconnect bridge device 400. In an alternate embodiment of the assembly process, the back-side processing of the bridge wafer includes removal of the first temporary carrier substrate 300, but not formation of flip-chip bumps on the bottom-side bond pads 314 of the bridge wafer. In this instance, the bond pads 314 would be bonded to area array flip-chip bumps formed on a surface of the package substrate. In yet another embodiment, as noted above, back-side processing may be performed following removal of the first temporary carrier substrate 300 to form an array of bonding pads or redistribution layers, etc., on the exposed back-side of the bridge wafer.

Figure 9:
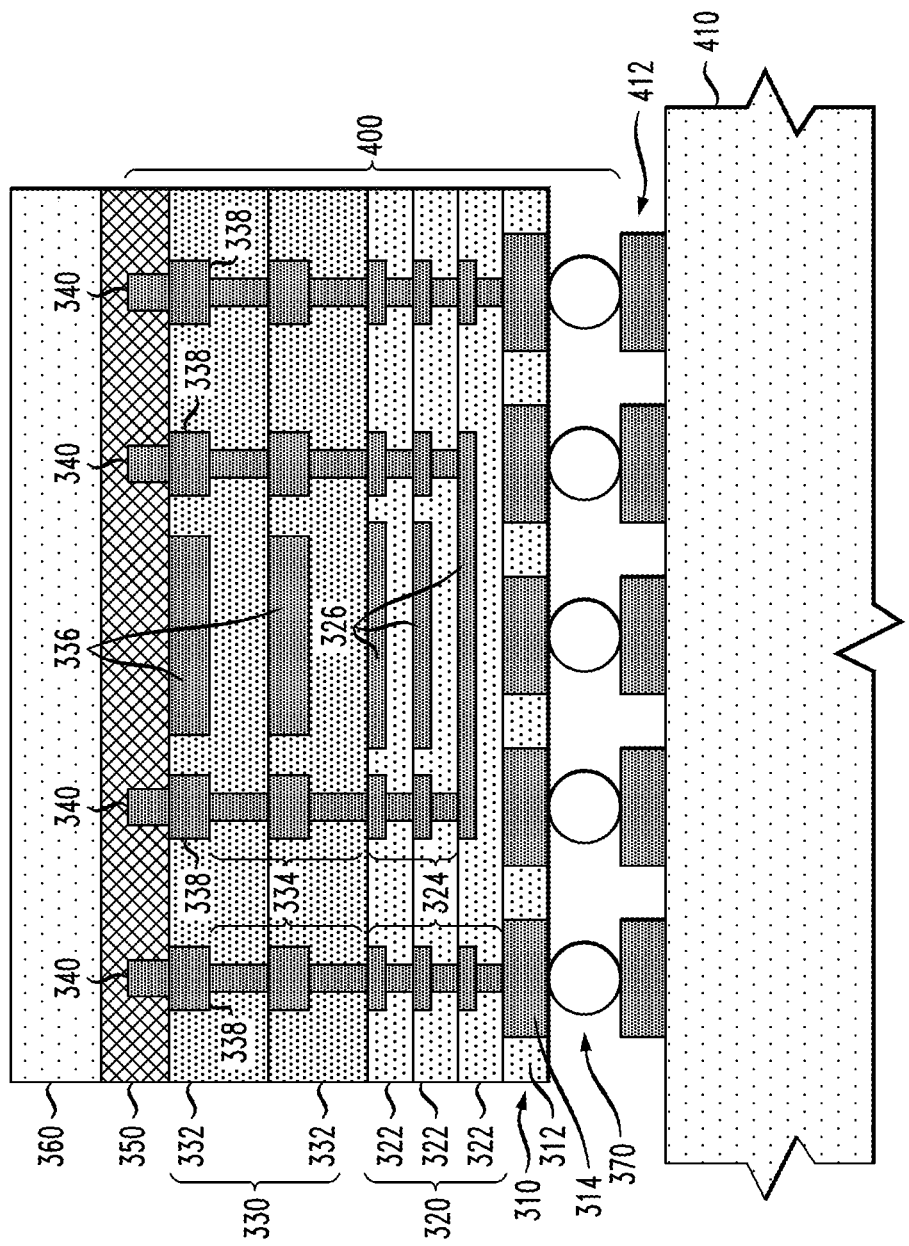
FIG. 9 is a cross-sectional side view of a package structure at an intermediate stage of assembly where the chip interconnect bridge device of FIG. 8 is connected to a package substrate.

FIG. 9 is a cross-sectional side view of a package structure at an intermediate stage of assembly where the chip interconnect bridge device 400 of FIG. 8 is connected to a package substrate 410. The package substrate 410 comprises an area array of bond pads 412 (or pillar structures, or solder capped bumps, etc.) formed on a surface of the package substrate 410. In one embodiment, the surface region of the portion of the package substrate 410 shown in FIG. 9 is a bottom surface of a recessed cavity of the package substrate 410 in which the bridge device 400 is disposed (e.g., FIG. 1). In another embodiment, the surface region of the portion of the package substrate 410 shown in FIG. 9 is an upper surface of the package substrate 410 on which the bridge device 400 is disposed (e.g., FIG. 2). In yet another embodiment, the solder bumps 370 shown in FIG. 9 can be formed initially on the bond pads 412 of the package substrate 410 where the bottom side bond pads 314 of the bridge device 400 would be bonded to the solder bumps 370 of the package substrate 410. The chip interconnect bridge device 400 can be connected to the package substrate 410 using solder reflow or thermo-compression bonding.

Figure 10:
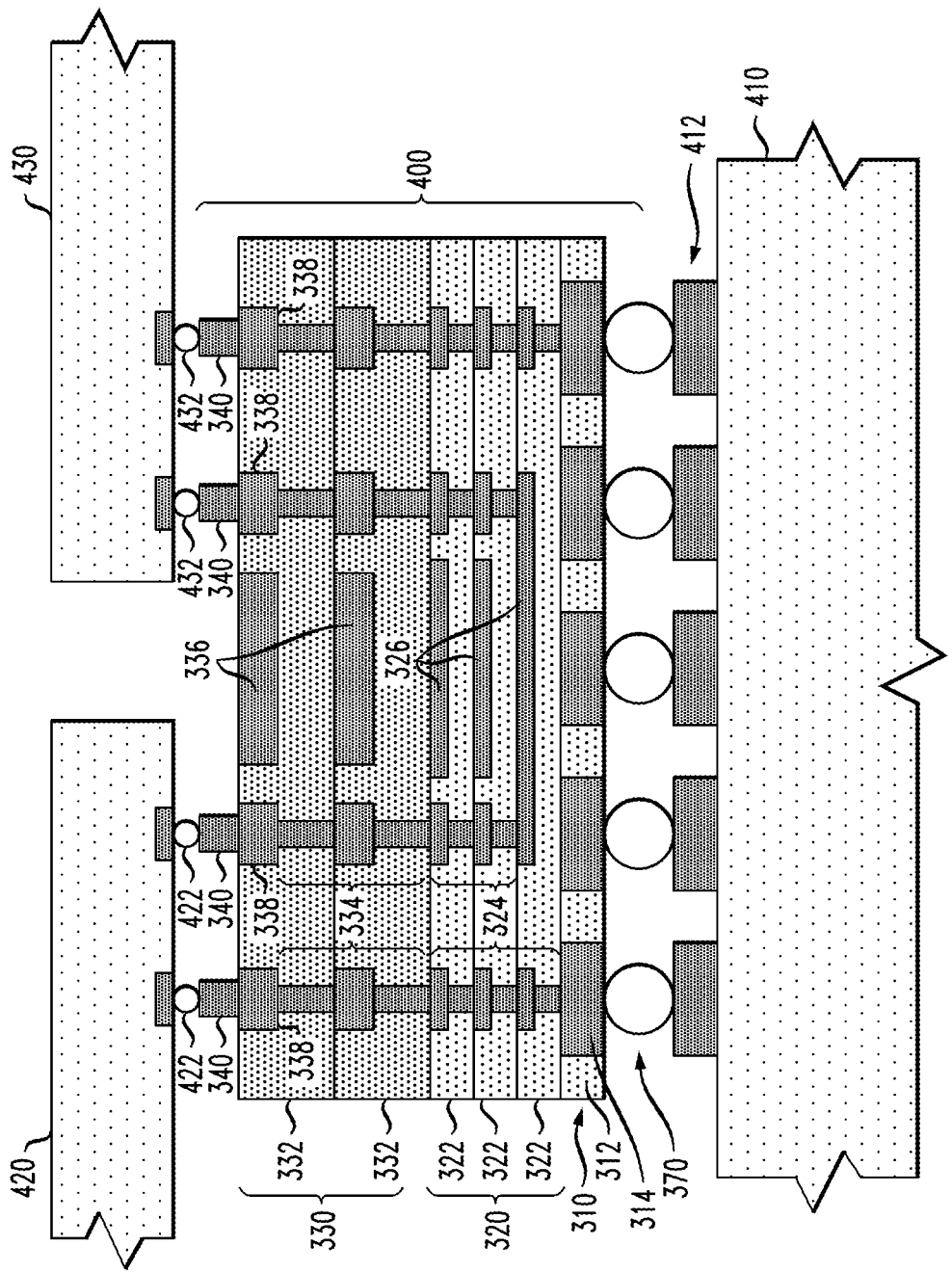
FIG. 10 is a cross-sectional side view of the package structure of FIG. 9 after removing the remaining portion of the second temporary carrier substrate from the chip interconnect bridge and connecting a plurality of IC chips to the chip interconnect bridge device and the package substrate.

Next, FIG. 10 is a cross-sectional side view of the package structure of FIG. 9 after removing the remaining portion of the second temporary carrier substrate 360 (or wafer dicing tape) from the chip interconnect bridge device 400 and flip-chip connecting a plurality of IC chips 420 and 430 to the chip interconnect bridge device 400. The IC chips 420 and 430 comprise respective fine-pitch area arrays of flip-chip bumps 422 and 432, which are bonded to the fine-pitch flip-chip bumps 340 on the top-side of the bridge device 400. In addition, while not specifically shown in FIG. 10, the IC chips 420 and 430 would be flip-chip bonded to the package substrate 410 using coarser pitch flip chip connections (e.g., C4 connections, solder-capped copper pillars, etc.), as discussed above with reference to FIGS. 1 and 2. The IC chips 420 and 430 can be connected to the bridge device 400 and the package substrate 410 using solder reflow or thermo-compression bonding.

Figure 11:
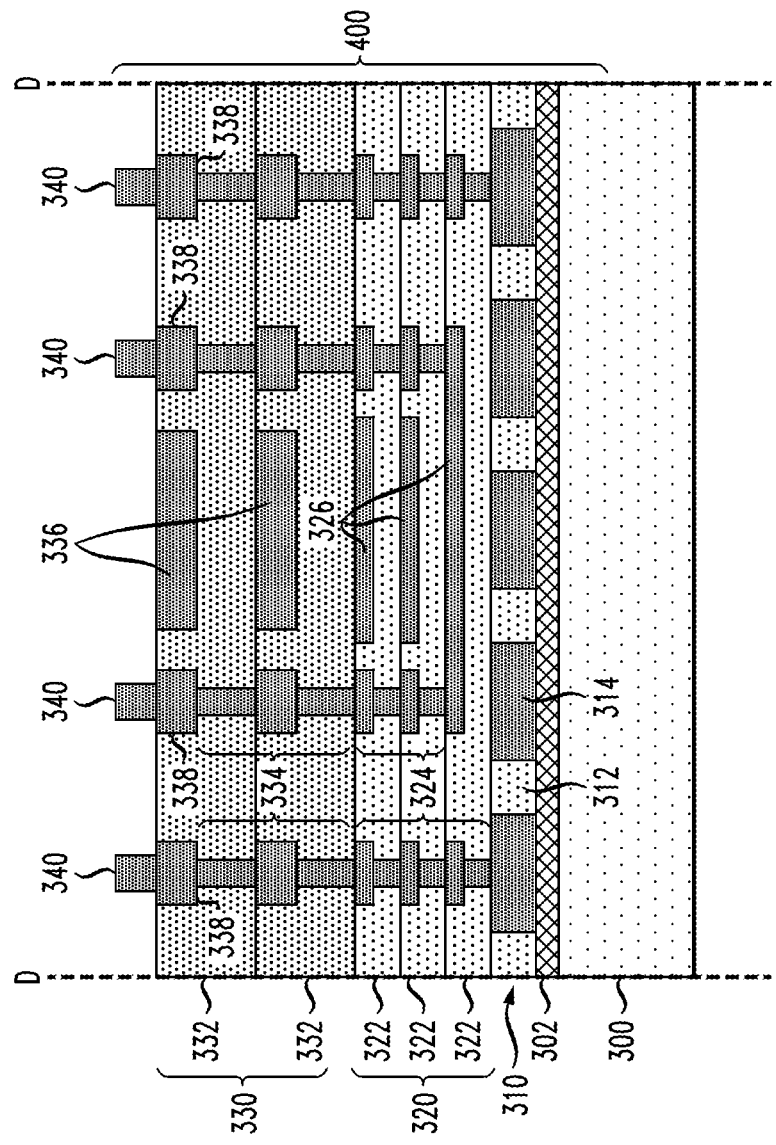
FIG. 11 is a cross-sectional side view of the bridge wafer of FIG. 6, after dicing the bridge wafer and the first temporary carrier substrate to form an individual chip interconnect bridge device.
Figure 12:
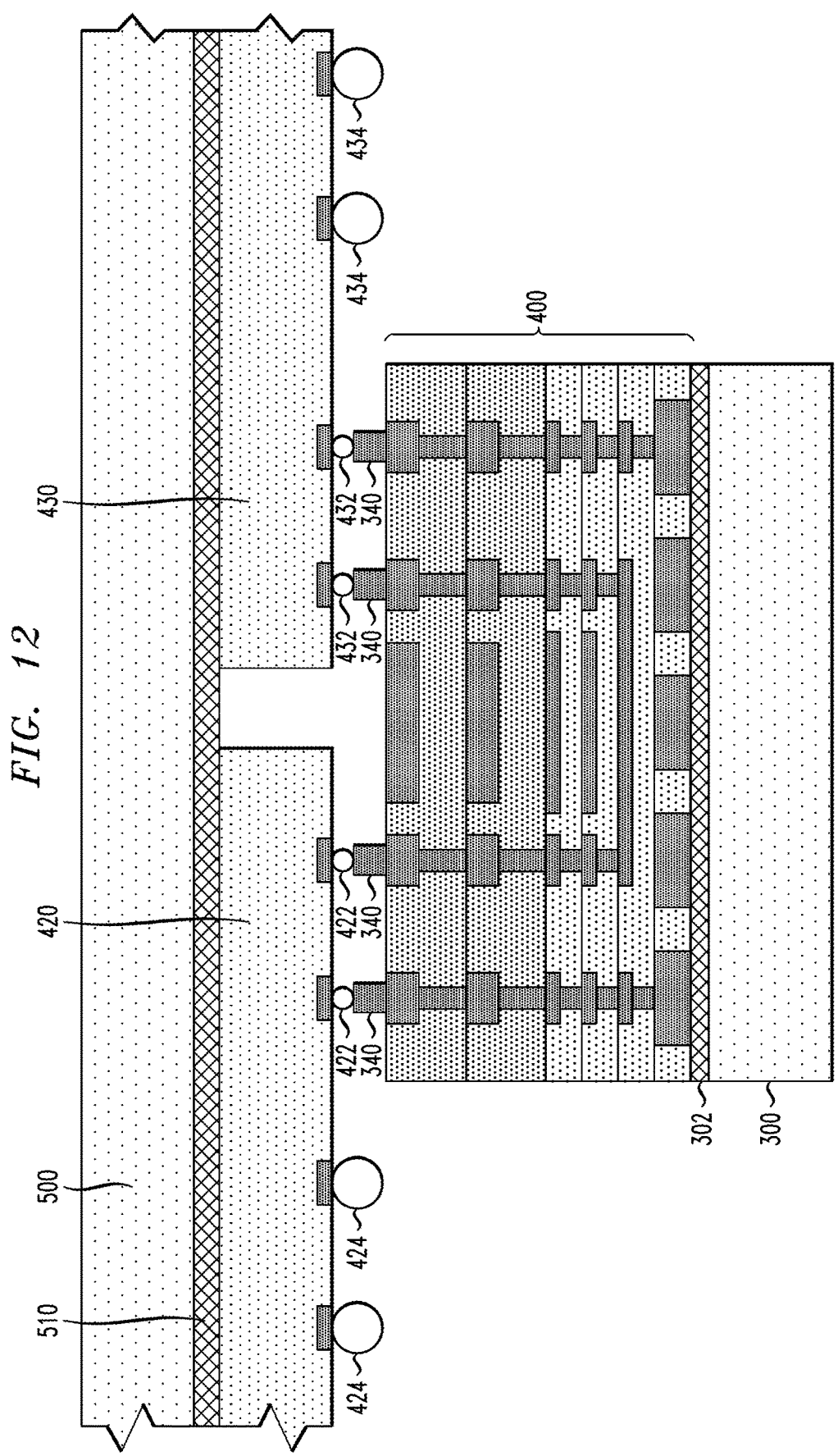
FIG. 12 is a cross-sectional side view of a package structure at an intermediate stage of assembly where a plurality of IC chips mounted to a temporary chip carrier substrate are connected to the chip interconnect bridge device of FIG. 11.
Figure 13:
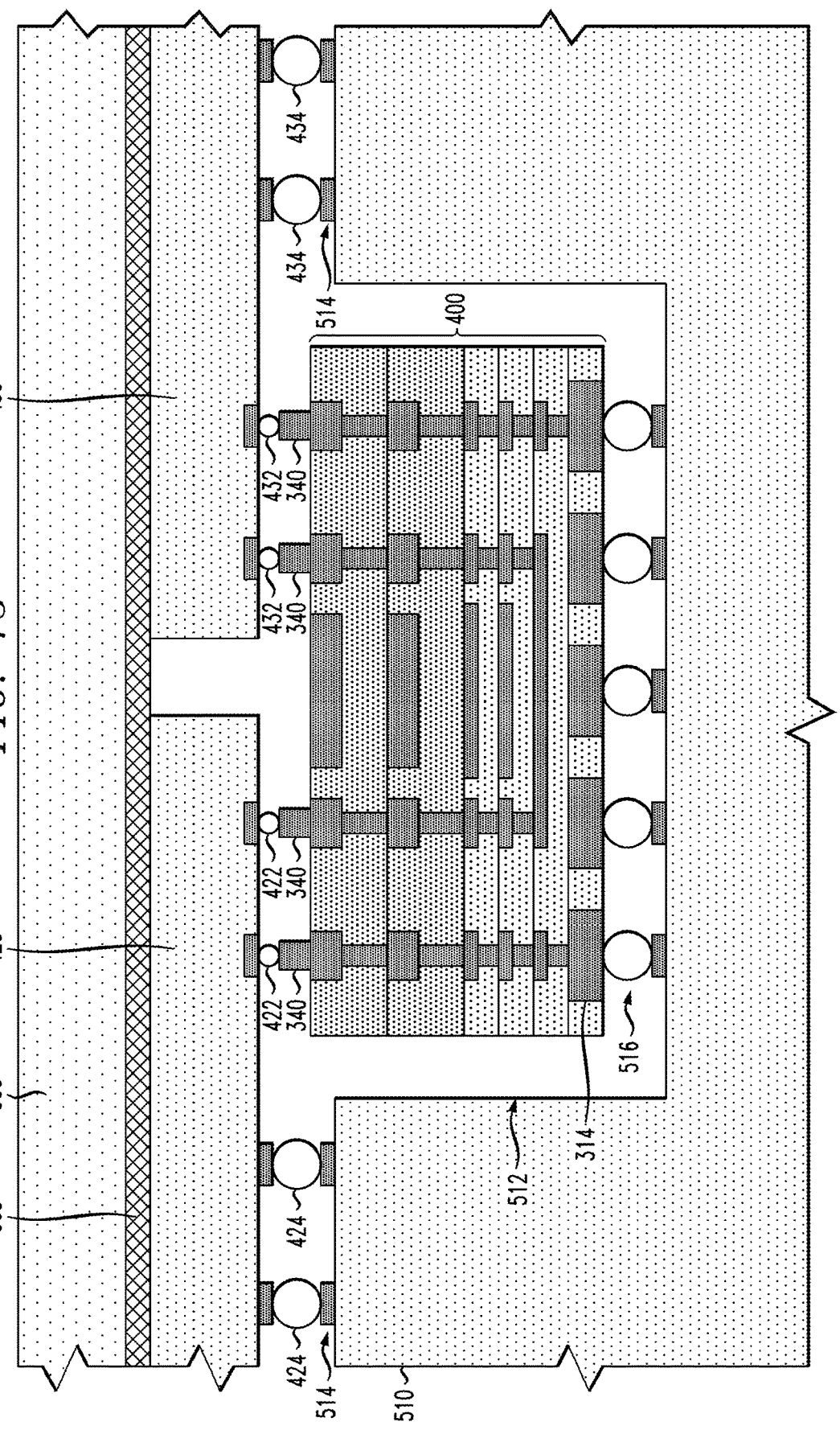
FIG. 13 is a cross-sectional side view of the package structure of FIG. 12 after removing a remaining portion of the first temporary carrier substrate from the bottom-side of the chip interconnect bridge device, and connecting the assembly of the IC chips and the chip interconnect bridge device to a package substrate.

FIGS. 11 through 13 schematically illustrate a "chip-first" package assembly process following the bridge wafer fabrication process of FIGS. 1-6, according to an embodiment of the invention. In particular, FIG. 11 is a cross-sectional side view of the bridge wafer of FIG. 6, after dicing the bridge wafer and the first temporary carrier substrate 300 along dicing lines D (illustrated by dashed lines) to form an individual chip interconnect bridge device 400. In this assembly process, the first temporary carrier substrate 300 remains bonded to the bridge wafer during the wafer dicing process so that individual bridge devices that are formed as a result of the dicing process are supported by respective portions of the first temporary carrier substrate 300, as shown in FIG. 11.

Next, FIG. 12 is a cross-sectional side view of a package structure at an intermediate stage of assembly where a plurality of IC chips 420 and 430, which are mounted to a temporary chip carrier substrate 500, are connected to the chip interconnect bridge device 400 of FIG. 11. The chip carrier substrate 500 is bonded to the IC chips 420 and 430 using any suitable releasable adhesive layer 505. In another embodiment, a precision fixture can be utilized to temporarily hold the IC chips 420 and 420 with either a vacuum system or a releasable adhesive layer. The IC chips 420 and 430 comprise respective fine-pitch area arrays of flip-chip bumps 422 and 432, which are bonded to the fine-pitch flip-chip bumps 340 on the top-side of the bridge device 400. In addition, the IC chips 420 and 430 comprise area arrays of flip-chip bumps 424 and 434 (e.g., C4 connections, solder-capped copper pillars, etc.), which can be formed with a coarse pitch or fine pitch. The flip-chip bumps 424 and 434 may be bumps/pillars of the same size as flip-chip bumps 422 and 432, but at a relaxed pitch. The IC chips 420 and 430 can be connected to the bridge device 400 using solder reflow or thermo-compression bonding.

FIG. 13 is a cross-sectional side view of the package structure of FIG. 12 after removing a remaining portion of the first temporary carrier substrate 300 from the bottom-side of the bridge device 400, and connecting the assembly of the IC chips 420 and 430 and the chip interconnect bridge device 400 of FIG. 12 to a package substrate 510. The package substrate 510 comprises a recessed cavity 512 formed in the top-side surface of the package substrate 510. The package substrate 510 comprises area arrays of bond pads 512 formed on the top-side surface of the package substrate 510 which are bonded to the area array flip-chip bumps 424 and 434 on the back-sides of the IC chips 420 and 430. In addition, the package substrate 510 comprises an area array of flip-chip bumps 516 formed on a bottom surface of the recessed cavity 512, which are bonded to the respective bonding pads 314 of the area array of boding pads exposed at the bottom surface of the bridge device 400. It is to be understood that the exemplary chip-first assembly scheme could be used to assemble a package structure comprising bridge structures mounted to the top-side of the laminate package substrate.

The exemplary bridge fabrication and package assembly techniques discussed above utilize WLFO techniques and fine pitch BEOL patterning enable formation of the interconnect bridge device 400 which provides high interconnect density between adjacent chips 420 and 430, while simultaneously enabling vertical power distribution through the bridge device 400 using stacked wiring and vias in the bridge device 400 which provide package traces for routing and distributing power/ground bump connections between the package substrate 510 and bottom-side of the bridge device 400 to power/ground bump connections between the IC chips 420 and 430 and the top-side surface of the bridge device 400. In an alternate embodiment chip interconnect bridges can be built on ceramic or organic carriers with panel processing and relaxed feature sizes.

In other embodiments, solder hierarchies are implemented to assemble package structures comprising package substrates, bridge devices, and IC chips. The solder hierarchies will vary depending on whether a "chip-first" or "chip-last" assembly process is implemented to construct the package structure. The solder hierarchies take into consideration potential misalignment of flip-chip bump connections which can arise during a direct chip attachment operation due to, e.g., (i) differences in the coefficient of thermal expansion (CTE) of the different materials that make up the IC dies and interconnect bridge devices, and (ii) surface tension forces of larger, coarse pitch solder bumps which can cause misalignment of smaller, fine pitch solder bumps, for example, during solder reflow.

For example, with a "chip-first" assembly process, a low-temperature solder can be used for the small, fine pitch micro bump connections between the IC chips and the bridge device. The low temperature solder enables bonding of the bridge device and the IC chips at lower temperature, which minimizes the differential expansion between the IC chips and the bridge devices. In this manner, the low-temperature solder will reflow and bond at low temperatures, and minimize differential expansion between the IC dies and the bridge interconnect structure. Therefore, as the assembly cools, the shrinking IC dies will not cause substantial stresses on the interconnect bridge device, which could otherwise cause bending and cracking of the interconnect bridge device.

Various solder hierarchies according to embodiments of the invention can be implemented with "chip-last" assembly process. As noted above, with a "chip-last" assembly process, the interconnect bridge device is initially direct chip attached to the package substrate, followed by direct chip attaching the IC dies to both the bridge device and package substrate. In this assembly process, the IC dies and bridge devices are bonded using fine pitch bump interconnects, and the IC dies and package substrate are bonded using coarse pitch bump interconnects. As explained in further detail below, different soldering hierarchies can be utilized to ensure alignment and bonding of the fine pitch bump interconnects between the IC dies and the bridge device before bonding the coarser pitch bump interconnects between the IC dies and the package substrate.

In one embodiment each IC die comprises flip-chip bumps with two size C4s, e.g., 150-micron pitch bumps (coarse pitch bumps) such as SAC305 or SnBi95), and 55-micron pitch bumps (fine pitch bumps) such as SAC305 or SnBi95. In addition, the bridge device comprises fine pitch micro bumps which comprise a low-temperature melting solder such as SnBi (58%) formed on bond pads of the bridge device, which that melts at 138 degrees C. During the solder reflow, the low-temperature solder on the bond pads of the bridge device will melt first and pull the corresponding fine pitch bumps on the bottom side of the IC die, which results in alignment of the IC die to both the bridge device and the package substrate. With this process, the element is incorporated into the melt by, e.g., using a small mass of low melt solder on one side and large amount on the other side, or by using a metallurgy (such as gold) on the low melt side that will be pulled into the melt.

Figure 14:
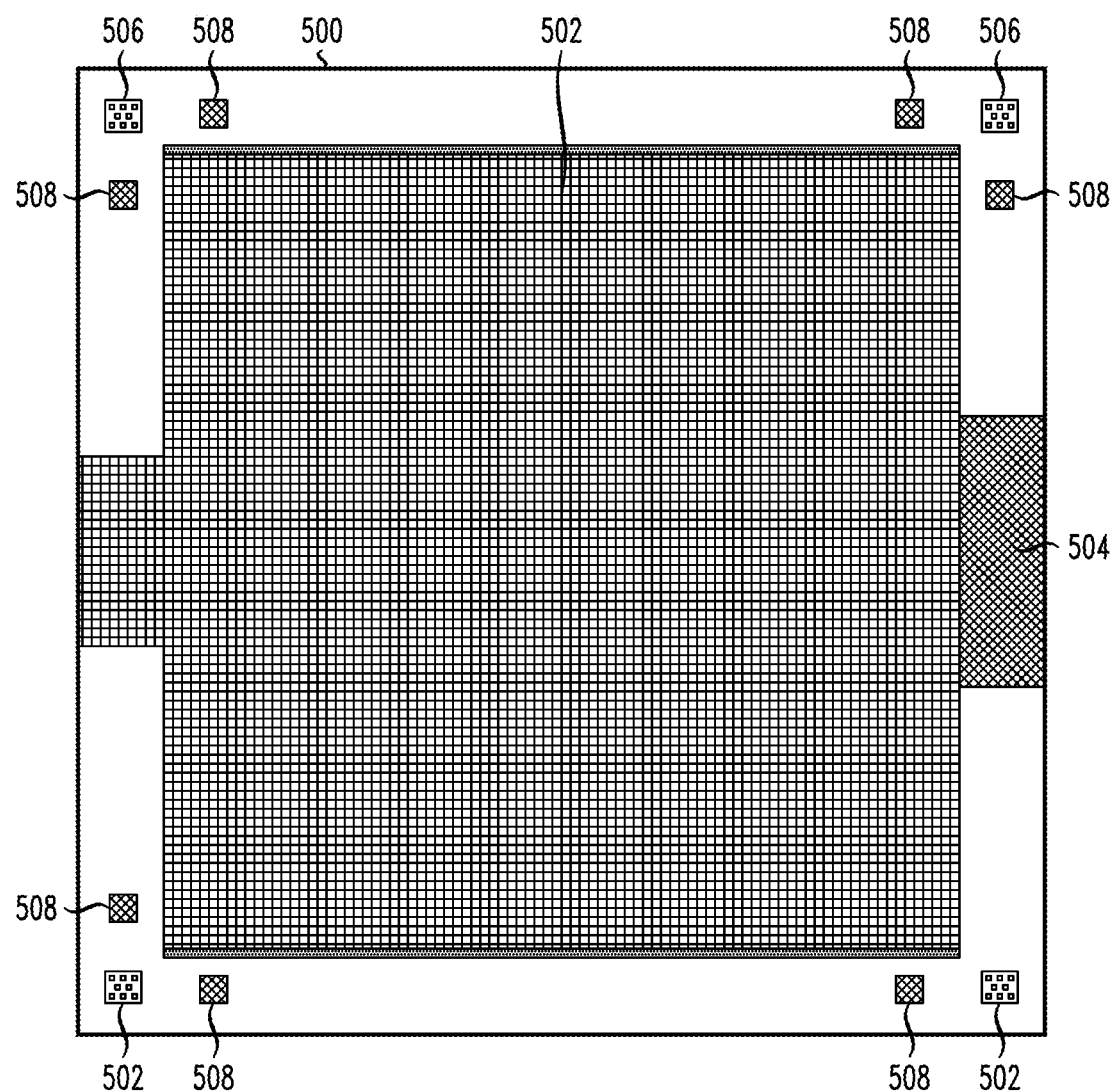
FIG. 14 is a plan view of a back-side surface of an IC chip showing an arrangement of alignment pads for chip alignment using a hierarchical soldering process to assemble a package structure, according to an embodiment of the invention.

Other embodiments of solder hierarchies for "chip-last" assembly methods utilized alignment pads on the back-side of the IC dies. For example, FIG. 14 is a plan view of a back-side surface of an IC die 500 showing an arrangement of alignment pads for chip alignment using a hierarchical soldering process to assemble a package structure, according to an embodiment of the invention. The back-side of the IC die 500 comprises a bump interconnect region 502 which comprises standard coarse pitch C4 bumps for direct chip attaching the IC die 500 to a package substrate, and a fine pitch micro bumps 504 (e.g., 55-micron pitch) for direct chip attaching the IC die 500 to a bridge device. The fine pitch micro bumps 504 include solder with a lower melting temperature (e.g., 20 degrees C. lower) that the coarse pitch bumps in the bump interconnect region 502. In addition, the back-side of the IC dies 500 comprises alignment pad regions 506 in the corners of the IC die 500 which have large pitch alignment pads with the lowest melting temperature solder, and alignment pad regions 508 with fine pitch (e.g., 20 to 40-micron pitch) with the lowest melting temperature solder.

In one embodiment, a solder hierarchy utilizes three size C4s with the largest pitch C4s (e.g., 250-micron pitch) disposed in the alignment pad regions 506 on the corners of the IC die 500 for gross alignment. In particular, the IC die 500 comprise the lowest temperature melting solder (e.g., 118 degrees C.) on the alignment pads 506 for gross alignment. The fine pitch bump region 504 (e.g., 55-micron pitch) for the bridge device has the next lowest temperature melting solder (e.g., 138 degrees C.), and the standard C4 bumps in the region 502 (e.g., 150-micron pitch) have the highest temperature melting solder.

In another embodiment, a solder hierarchy utilizes three size C4s with the smallest pitch/large area for finer alignment (finer than that needed for the bridge device). In particular, the fine pitch alignment regions (e.g., 20 micron to 40 micron pitch) haves solder bumps with the lowest temperature melting solder (e.g., 118 degrees C.) for ultra-fine alignment. The fine pitch bump region 504 (e.g., 55 micron pitch) for the bridge device has the next lowest temperature melting solder (e.g., 138 degrees C.), and the standard C4 bumps in the region 502 (e.g., 150 micron pitch) have the highest temperature melting solder.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for constructing a package structure comprising:
   constructing an interconnect bridge wafer on a first carrier substrate, wherein constructing the interconnect bridge wafer comprises:
      forming a first layer of bond pads on the first carrier substrate, wherein the first layer of bond pads comprises metallization disposed within an organic dielectric layer; and
      forming, over the first layer of bond pads, a build-up of multiple layers of inorganic dielectric material and patterned metallization to provide interlayer vias and lateral traces, wherein the multiple layers of inorganic dielectric material and patterned metallization comprise a second layer of bond pads, and a plurality of dielectric layers and metallization layers between the first and second layers of bond pads, to provide interconnect wiring between bond pads of the second layer of bond pads and to provide interconnect wiring between bond pads of the first and second layers of bond pads;
   attaching a second carrier substrate to the second layer of bond pads of the interconnect bridge wafer;
   removing the first carrier substrate to expose the first layer of bond pads;
   dicing the interconnect bridge wafer and the second carrier substrate to form an interconnect bridge device with a portion of the second carrier substrate connected thereto;
   direct chip attaching the first layer of bond pads of the interconnect bridge device to a package substrate;
   removing the portion of the second carrier substrate connected to the interconnect bridge device to expose the second layer of bond pads of the interconnect bridge device; and
   direct chip attaching a first integrated circuit die and a second integrated circuit die to the second layer of bond pads of the interconnect bridge device and to the package substrate;
   wherein the interconnect wiring between the bond pads of the second layer of bond pads of the interconnect bridge device provides die-to-die interconnects between the first and second integrated circuit dies connected to bridge device; and
   wherein the interconnect wiring between the bond pads of the first and second layers of bond pads provides package-to-die connections between the package substrate and the first and second integrated circuit dies, wherein the package-to-die connections comprise power connections.

2. The method of claim 1, wherein the interconnect bridge wafer is constructed layer by layer using a back-end-of-line fabrication process.

3. The method of claim 1, further comprising forming interconnect bumps on the bond pads of the first layer of bond pads of the interconnect bridge device, prior to direct chip attaching the interconnect bridge device to the package substrate.

4. The method of claim 1, further comprising forming interconnect bumps on the bond pads of the second layer of bond pads of the interconnect bridge device, prior to direct chip attaching the first and second integrated circuit dies to the interconnect bridge device.

5. The method of claim 1, wherein the interconnect bridge device and the first and second integrated circuit dies are connected to a planar surface of the package substrate.

6. The method of claim 5, wherein direct chip attaching the first integrated circuit die and the second integrated circuit die to the second layer of bond pads of the interconnect bridge device and to the package substrate, comprises:
   forming standoff structures on the planar surface of the package substrate; and
   direct chip attaching the first and second integrated circuit dies to the package substrate using the standoff structures;
   wherein the standoff structures are configured to offset a height of the interconnect bridge device mounted to the planar surface of the package substrate.

7. The method of claim 6, wherein the standoff structures comprise one of (i) copper pillar structures and (ii) solder-coated copper balls that are formed on contact pads on the planar surface of the package substrate.

8. The method of claim 1, wherein direct chip attaching the first integrated circuit die and the second integrated circuit die to the second layer of bond pads of the interconnect bridge device, comprises:
   using a first array of interconnect bumps to attach the first integrated circuit die to bond pads of the second layer of bond pads on a top surface of the interconnect bridge device; and
   using a second array of interconnect bumps to attach the second integrated circuit die to bond pads of the second layer of bond pads on the top surface of the interconnect bridge device;
   wherein the first and second arrays of interconnect bumps have a first connection pitch of 55 microns or less.

9. The method of claim 8, wherein direct chip attaching the first layer of bond pads of the interconnect bridge device to the package substrate, comprises:
   using a third array of interconnect bumps to attach the first layer of bond pads on a bottom surface of the interconnect bridge device to the planar surface of the package substrate;
   wherein the third array of interconnect bumps has a second connection pitch which is one of equal to and greater than the first connection pitch.

10. The method of claim 1, wherein the interconnect wiring of the interconnect bridge device comprises sub-micron line-width and sub-micron line-spacing.

11. The method of claim 1, wherein the first integrated circuit die comprises a memory die and wherein the second integrated circuit die comprises a processor die.

12. The method of claim 1, wherein the package substrate comprises one of a ceramic substrate and an organic laminate build-up substrate.

13. A method for constructing a package structure comprising:
   constructing an interconnect bridge wafer on a first carrier substrate, wherein constructing the interconnect bridge wafer comprises:
      forming a first layer of bond pads on the first carrier substrate, wherein the first layer of bond pads comprises metallization disposed within an organic dielectric layer; and
      forming, over the first layer of bond pads, a build-up of multiple layers of inorganic dielectric material and patterned metallization to provide interlayer vias and lateral traces, wherein the multiple layers of inorganic dielectric material and patterned metallization comprise a second layer of bond pads, and a plurality of dielectric layers and metallization layers between the first and second layers of bond pads, to provide interconnect wiring between bond pads of the second layer of bond pads and to provide interconnect wiring between bond pads of the first and second layers of bond pads;

dicing the interconnect bridge wafer and the carrier substrate to form an interconnect bridge device with a portion of the carrier substrate connected thereto;

direct chip attaching a first integrated circuit die and a second integrated circuit die to the second layer of bond pads of the interconnect bridge device;

removing the portion of the carrier substrate connected to the interconnect bridge device to expose the first layer of bond pads of the interconnect bridge device; and direct chip attaching the first layer of bond pads of the interconnect bridge device and the first and second integrated circuit dies to a package substrate;

wherein the interconnect wiring between the bond pads of the second layer of bond pads of the interconnect bridge device provides die-to-die interconnects between the first and second integrated circuit dies connected to bridge device; and wherein the interconnect wiring between the bond pads of the first and second layers of bond pads provides package-to-die connections between the package substrate and the first and second integrated circuit dies, wherein the package-to-die connections comprise power connections.

14. The method of claim 13, wherein the interconnect bridge wafer is constructed layer by layer using a back-end-of-line fabrication process.

15. The method of claim 13, further comprising forming interconnect bumps on the bond pads of the second layer of bond pads of the interconnect bridge device, prior to direct chip attaching the first and second integrated circuit dies to the interconnect bridge device.

16. The method of claim 13, wherein the package substrate comprises a recessed cavity formed in a surface of the package substrate, and wherein direct chip attaching the first layer of bond pads of the interconnect bridge device and the first and second integrated circuit dies to the package substrate, comprises:

placing the interconnect bridge device within the recessed cavity;

attaching the first layer of bond pads of the interconnect bridge device to a bottom surface of the recessed cavity; and attaching the first and second integrated circuit dies to the surface of the package substrate.

17. The method of claim 13, wherein the interconnect wiring of the interconnect bridge device comprises sub-micron line-width and sub-micron line-spacing.

18. The method of claim 13, wherein the first integrated circuit die comprises a memory die and wherein the second integrated circuit die comprises a processor die.

19. The method of claim 13, wherein the package substrate comprises one of a ceramic substrate and an organic laminate build-up substrate.

* * * * *